United States Patent [19]

Finger

[11] 4,388,618
[45] Jun. 14, 1983

[54] BATTERY STATE OF CHARGE INDICATOR OPERATING ON BIDIRECTIONAL INTEGRATIONS OF TERMINAL VOLTAGE

[75] Inventor: Eugene P. Finger, Brewster, N.Y.

[73] Assignee: Curtis Instruments, Inc., Mt. Kisco, N.Y.

[21] Appl. No.: 223,041

[22] Filed: Jan. 7, 1981

[51] Int. Cl.³ ............................................. G08B 21/00
[52] U.S. Cl. ...................................... 340/636; 320/48; 324/428
[58] Field of Search ....................... 340/519, 636, 522; 320/48; 307/10 BP, 64, 66; 324/428, 427, 433

[56] References Cited

U.S. PATENT DOCUMENTS

| | | | |
|---|---|---|---|
| 3,447,060 | 5/1969 | Tedd | 320/48 |
| 3,475,061 | 10/1969 | Steinkamp et al. | 340/522 X |
| 4,019,120 | 4/1977 | Fattic | 340/636 X |
| 4,024,523 | 5/1977 | Arnold et al. | 340/636 |
| 4,025,916 | 5/1977 | Arnold et al. | 340/636 |
| 4,052,717 | 10/1977 | Arnold et al. | 340/636 X |
| 4,193,026 | 3/1980 | Finger et al. | 324/428 |

OTHER PUBLICATIONS

Paper No. 783201 (E)-Title: Unidirectional and Bidirectional Battery State-of-Charge Indicators and Charge Controllers-Date: 10001978, Author: E. P. Finger-Presented at: The Fifth International Electric Vehicle Symposium-Sponsored by: Electric Vehicle Council.

Primary Examiner—John W. Caldwell, Sr.
Assistant Examiner—Daniel Myer
Attorney, Agent, or Firm—Curtis Ailes

[57] ABSTRACT

Battery terminal voltage is measured on a continuing basis during both positive and negative voltage excursions with relation to a summed reference value to obtain a measured difference. The resultant measured difference causes the generation of convergence function signals which vary dependent upon the magnitude and polarity of the measured difference and a bi-directional integrator is connected to receive the convergence function signals to integrate in either direction dependent upon the polarity of the convergence function signals. A feedback is provided from the integrator to modify the summed reference value and the output of the integrator is indicated as a measure of the state-of-charge.

18 Claims, 9 Drawing Figures

CONSTANT RATE BATTERY DISCHARGE
VOLTAGE PROFILE

LOWER CURVE SHOWS ANTICIPATED
VOLTAGE PROFILE. UPPER CURVE SHOWS
ACTUAL VOLTAGE PROFILE INCLUDING
HOURLY REST INTERVALS.

CONVERGENCE FUNCTION

CONVERGENCE FUNCTION

CONVERGENCE FUNCTION

BATTERY STATE OF CHARGE INDICATOR OPERATING ON BIDIRECTIONAL INTEGRATIONS OF TERMINAL VOLTAGE

The present invention relates to improved systems for monitoring the discharge condition of an electric storage battery such as a lead acid battery. The invention is particularly useful for conditions of operation where varying loads are intermittently applied to the battery.

Many different approaches have been made to the problem of monitoring and indicating the discharge condition of electric storage batteries, especially in applications where the battery is first charged and then is used in the discharge mode for a considerable period of time, such as in a mobile vehicle, before it is again returned to the charger to be re-charged.

One valuable approach which has been made to this problem is by the use of an ampere-hour meter. Very accurate results have been obtained with such meters. However, accuracy is sometimes limited by the fact that the number of ampere hours obtainable from a battery depends very heavily upon the rate of discharge, fewer ampere hours being available when the battery is rapidly discharged. Furthermore, the ampere-hour meter approach requires insertion in the circuit of some means for measuring current, such as a current measuring shunt. That is not nearly so convenient as simply measuring the battery terminal voltage.

Various battery terminal voltage measurement systems have been employed for the purpose of monitoring battery discharge, with varying degrees of success. The present invention is in this category.

One voltage measurement technique for monitoring battery discharge consists of simply measuring the open circuit battery voltage. The stabilized open circuit battery voltage is a very accurate indication of the discharge state of the battery. However, it may take hours for the open circuit battery voltage to stabilize after each discharge interval, so that the stabilized reading is not available very much of the time. Furthermore, no open circuit battery voltage is available during a loaded condition of the battery.

Another approach is simply to measure and read the instantaneous battery terminal voltage on a continuing basis. However, this requires interpretation, since the terminal voltage varies during operation of the apparatus powered by the battery, having a depressed value during value loading, dependent upon the magnitude of the load.

Various unidirectional systems have been devised for detecting and registering downward excursions in battery voltage under load, as an indication of the discharge condition of the battery. Some of these have operated on the basis of recognition of a sustained under-voltage condition before any registration is made, and others are really under-voltage analyzers which recognize and register under-voltage conditions in a setting recognizing previously registered under-voltage conditions. Very accurate results have been obtained with such systems, especially when applied to apparatus having known patterns of loading, even where the loading is quite discontinuous, such as in the operation of industrial fork lift trucks. Examples of successful systems of this sort are disclosed in a prior U.S. Pat. No. 4,193,026 issued to Eugene P. Finger and Eugene A. Sands on Mar. 11, 1980 and assigned to Curtis Instruments Inc. of Mt. Kisco, N.Y.

As previously indicated above, in connection with the discussion of ampere hour discharge condition monitoring systems, the ampere hour capacity of a battery and thus its discharge condition, depends very much upon the rate of discharge. Thus, for instance, if a particular battery is discharged at a rate which will result in full discharge condition being achieved (at a cell terminal voltage of 1.75 volts) in one hour, the battery may provide only 45 ampere hours. However, if the battery is discharged at a rate which will cause complete discharge in six hours, 100 ampere hours may be obtained from the battery.

Not only is the ampere hour output capacity of the battery related to the rate of discharge, but it has also been discovered that the ampere hour battery capacity is related to the integrated discharge rate where the loading of the battery is discontinuous. Thus, even though the battery may be very heavily loaded for short intervals, if it is allowed to "rest" on lighter loads or no loads between the intervals of heavy loading, the battery capacity is extended almost as though the battery had been more lightly loaded on a continuous basis. While the prior systems of undervoltage analyzers manage to deal with this situation reasonably satisfactorily, it is desired to provide even further improvement in the response of a voltage measurement battery discharge condition monitoring system under conditions of discontinuous loading.

Accordingly, it is an important object of the present invention to provide an improved battery discharge monitoring system which not only detects undervoltage excursions, but which also detects voltage recoveries between undervoltage excursions and usefully factors in those voltage recoveries to improve the overall measurement of battery discharge condition.

One problem in measuring voltage recoveries as a part of measurement of battery discharge condition is that if the battery powered apparatus is operated in a regenerative mode, such as in an electric vehicle employing regenerative braking, the upward voltage excursion may be substantial during the regenerative braking. Therefore, the magnitude of that upward voltage excursion may strongly modify the operation of the voltage discharge monitoring system, even though the amount of energy added back into the battery from the regenerative mode may be insignificant.

Accordingly, it is another object of the invention to provide a bidirectional battery terminal voltage response system for monitoring battery discharge condition for detecting both negative voltage excursions and positive voltage excursions and which is appropriately resistant to positive voltage excursions of limited duration from regenerative braking or from other momentary charge conditions.

Another problem in measuring voltage recoveries as a part of the measurement of battery discharge condition is that the upward voltage excursion must not be immediately and fully registered, but must be carefully factored in accordance to a limited time-amplitude factor in order to provide the best accuracy in the registration of battery condition.

Accordingly, it is another object of the invention to provide a bi-directional battery terminal voltage response system for monitoring battery discharge condition for detecting both negative voltage excursions and positive voltage excursions, and which responds to positive voltage excursions in accordance with a limited predetermined time and amplitude responsive function of the positive voltage excursions.

Other objects and advantages of the invention will be apparent from the following description and the accompanying drawings.

In carrying out the invention there is provided a battery state-of-charge indicator comprising means for measuring battery terminal voltage on a continuing basis during both positive and negative voltage excursions with relation to a summed reference value, means including a fixed reference voltage source and a summing means for providing a summed reference value for comparison with said measurement, means for comparing said battery terminal voltage measurement with said summed reference value and for deriving a difference signal value, means responsive to said difference signal value for generating convergence function signals which vary dependent on the magnitude and polarity of said difference signal value, a bi-directional integrator connected to receive said convergence function signals and operable to integrate in one direction for positive convergence function signals and in the other direction for negative convergence function signals to provide an integrated output signal as a measure of the state-of-charge, said means for providing a summed reference value including feedback means connected from the output of said integrator to said summing means for summation of a predetermined function of the integrated output signal with the fixed reference voltage from said fixed reference voltage source to thereby modify said summed reference value.

Figure 1:
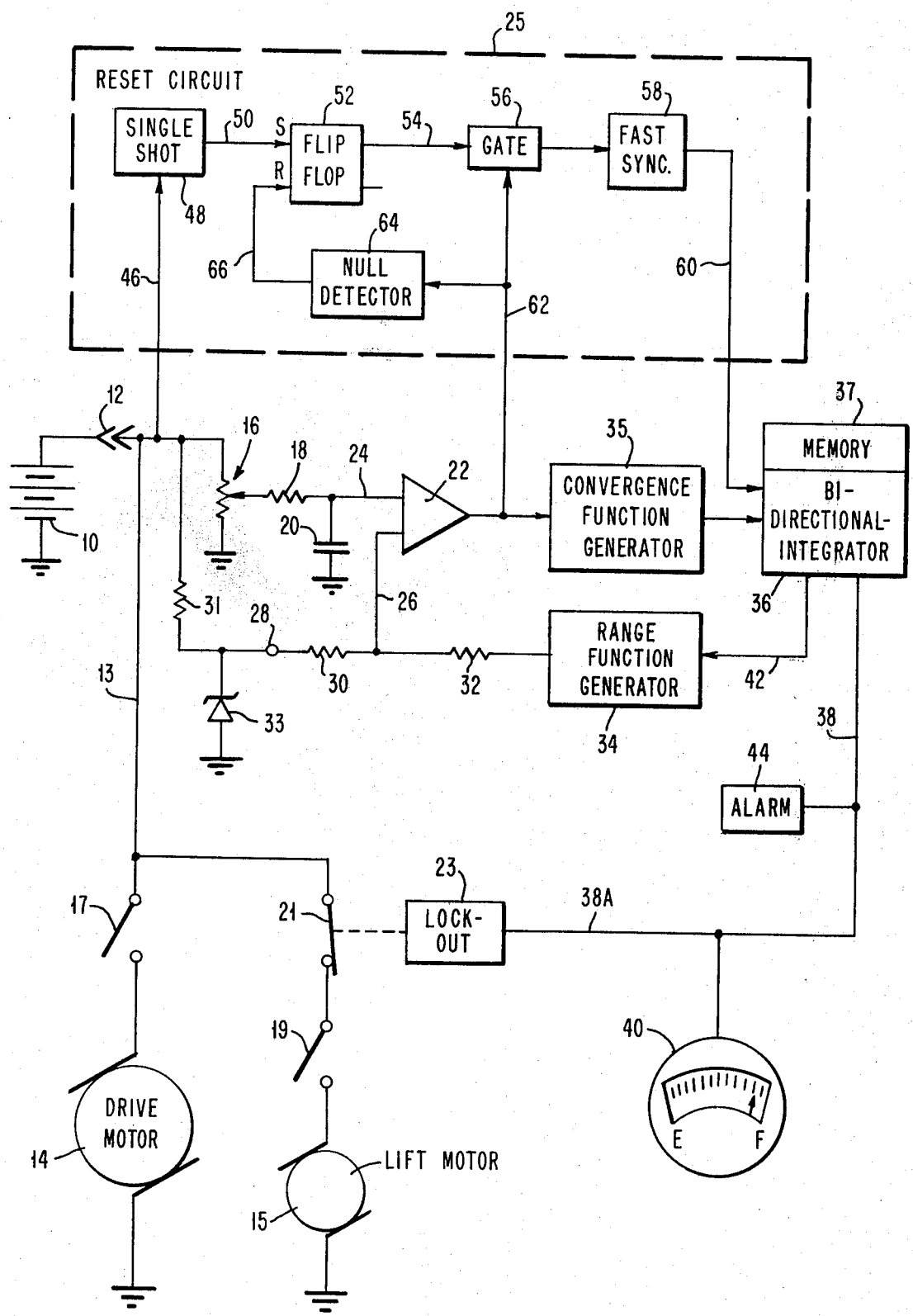
FIG. 1 is a schematic circuit diagram illustrating a preferred embodiment of the invention.
Figure 4:
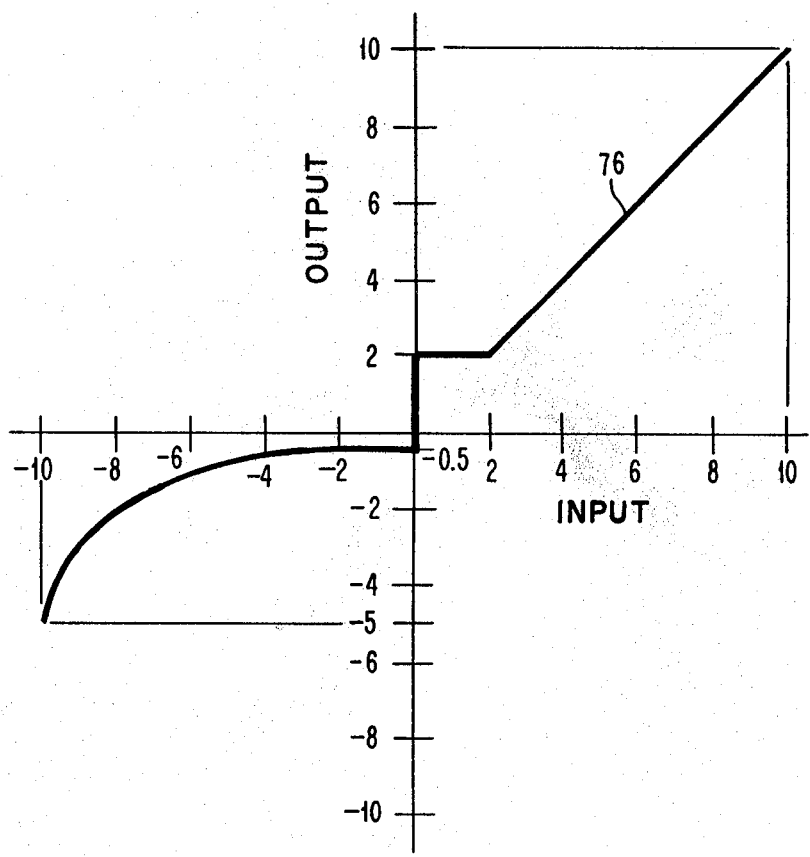
Figure 5:
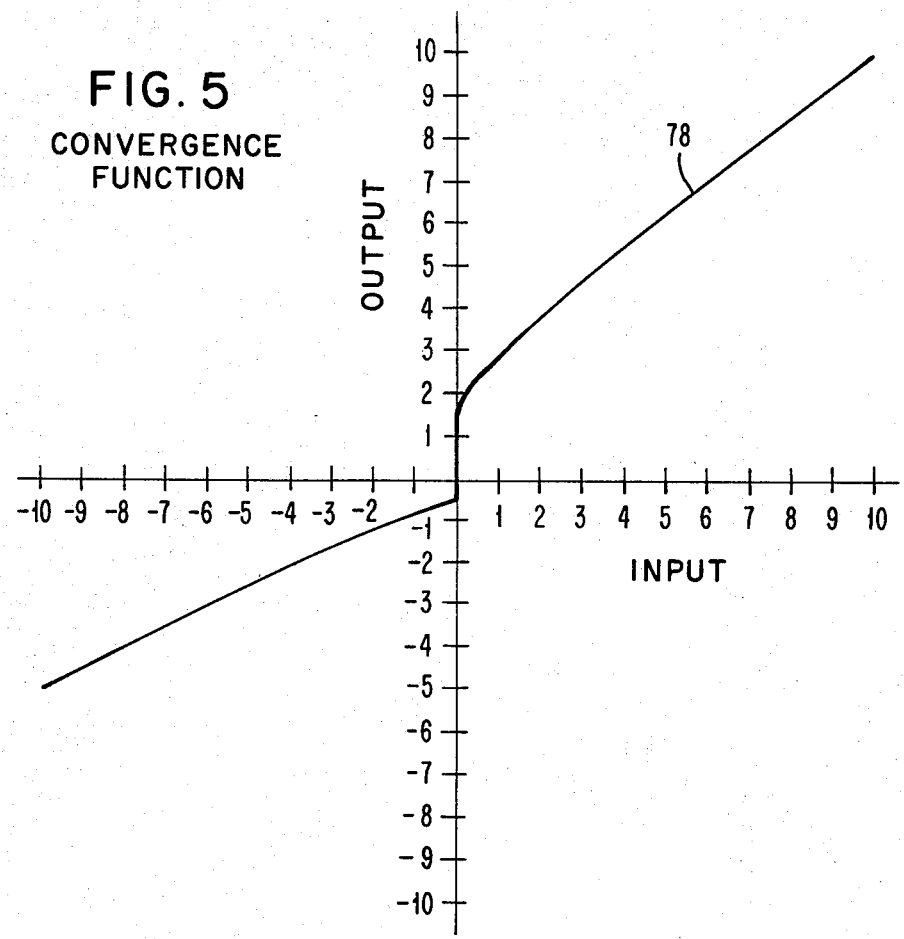
Figure 6:
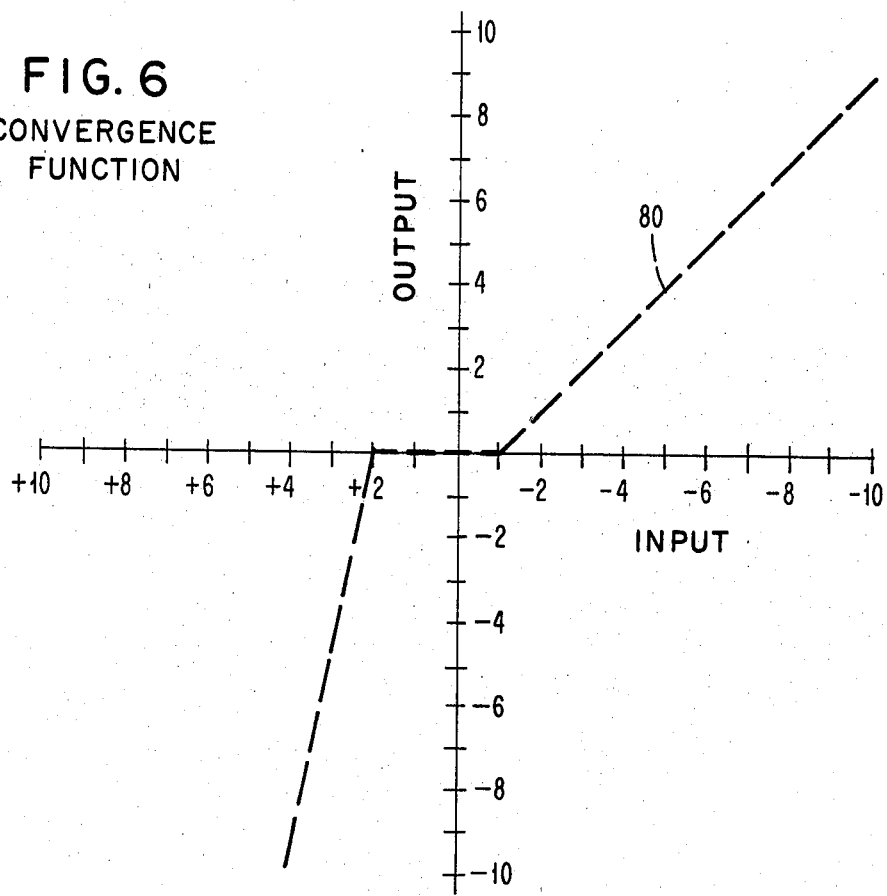

FIGS. 4, 5, and 6 illustrate several different functions which may be advantageously utilized in the system of FIG. 1.

Figure 7:
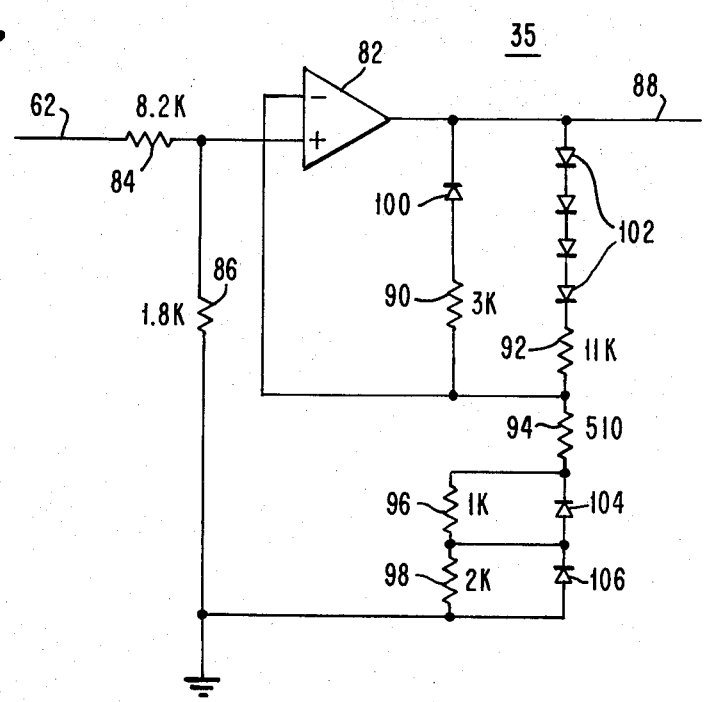

FIG. 7 illustrates a circuit which may be employed for generating the convergence function illustrated in FIG. 5.

Figure 8:
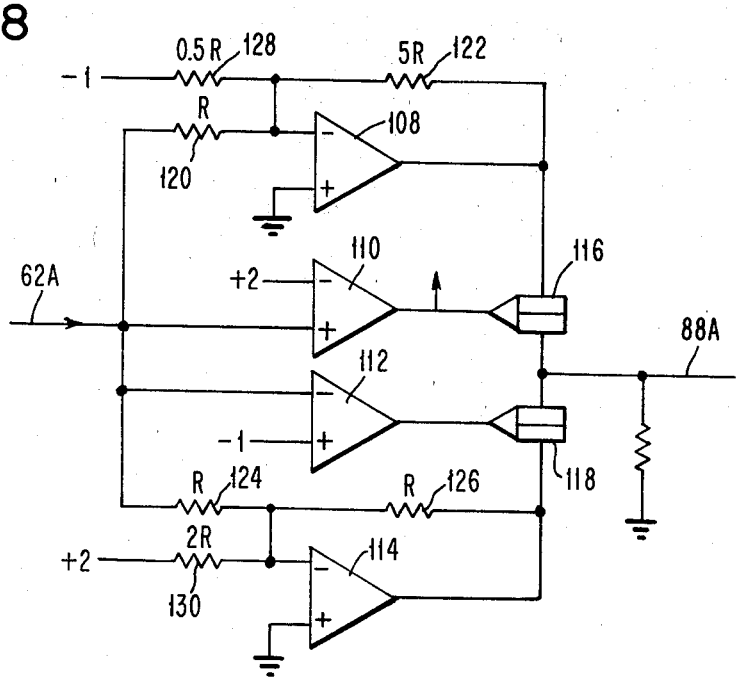

FIG. 8 illustrates a circuit which may be used to generate the convergence function illustrated in FIG. 6.

Figure 9:
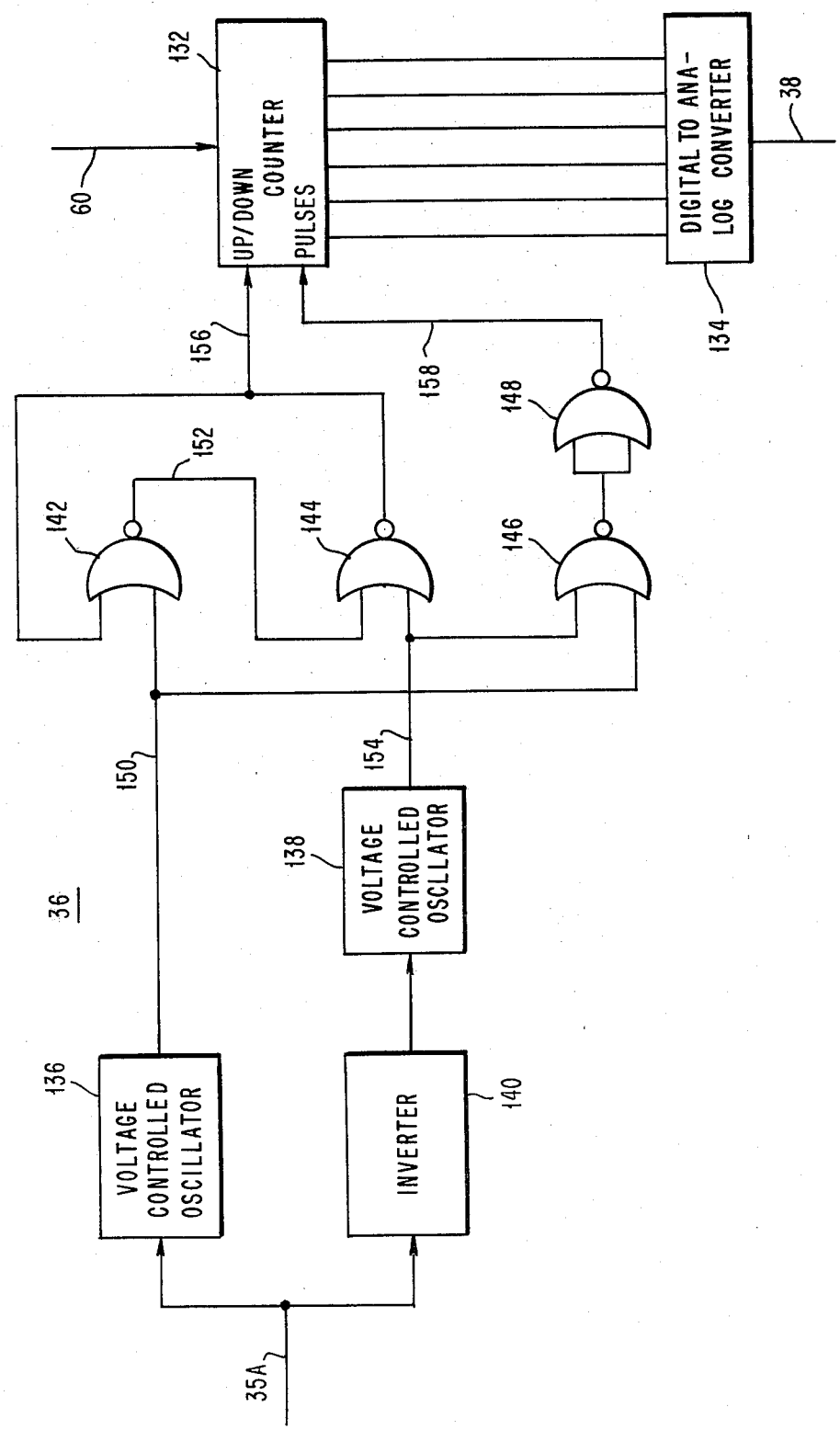

FIG. 9 illustrates a preferred embodiment of the bi-directional integrator of the system of FIG. 1 as carried out by means of a digital counter.

Referring more particularly to FIG. 1, there is shown a schematic circuit diagram of a simple preferred embodiment of the invention. The battery to which the apparatus is to be connected is indicated at 10. While only three cells are illustrated, the battery will usually include six to forty cells in typical applications of the system to twelve to eighty volt drives for apparatus such as an industrial forklift truck. The battery is connected by a connector device 12 through connector 13 and associated controls to motors 14 and 15, and to the battery state-of-charge indicator which is embodied in the remainder of the circuit, which is about to be described.

For illustrative purposes, it is assumed that the system is to be applied to an industrial forklift truck, and that the motor 14 is the propulsion drive motor, and the motor 15 is the lift motor. Appropriate controls are provided for the drive motor 14 as schematically represented by a simple switch 17. It will be understood that more elaborate controls will be provided, including the capability for reversing the drive motor. Similarly, a control switch 19 is illustrated for the lift motor 15. Again it will be understood that a more elaborate control is usually required. In series with the supply line for power to the lift motor 15, there is preferably provided a lock-out switch 21 which is normally closed, and which is operated to open by a lock-out circuit 23 actuated by the control system and described more fully below.

The state-of-charge indicator circuit optionally includes a reset circuit 25 which is described more fully below.

The state-of-charge indicator circuit preferably includes a voltage divider 16 which takes only a fixed fraction of the total battery terminal voltage to a low pass filter consisting of a series resistor 18 and a shunt capacitor 20. The output from the low pass filter is connected at 24 to one of the inputs of a difference amplifier 22, which may be an operational amplifier connected in a differential mode. The differential amplifier 22 compares the battery terminal voltage, in the form of the voltage as reduced by the voltage divider 16 and filtered by the low pass filter 18–20 at connection 24, with a summed reference voltage on connection 26. The summed reference voltage is supplied from a fixed reference voltage source indicated at 28 through a resistor 30 and from a function generator 34 through a resistor 32. Resistors 30 and 32 comprise a summing network. Function generator 34 is discussed more fully below.

The fixed voltage reference at terminal 28 is preferably a constant voltage, and may be derived from the battery 10 through resistor 31 in terms of a constant voltage drop across a Zener diode 33.

The difference signal from the output of differential amplifier 22 is supplied to a convergence function generator 35 which is operable to generate signals which vary dependent upon the magnitude and polarity of the difference signal value. However, the convergence function is generally positive for a positive difference signal value and negative for a negative difference signal value. The nature of the convergence function is discussed in greater detail below.

The resulting output from the convergence function generator 35 is supplied to a bi-directional integrator 36. Integrator 36 is operable to accumulate a time integrated value representative of the convergence function signals, and to integrate upwardly for positive convergence function signals, and downwardly for negative convergence function signals. The bi-directional integrator 36 necessarily and inherently includes a memory function which is operable while the circuit is in normal operation. However, the integrator 36 also preferably includes an auxiliary memory 37 which retains the storage of the integrated value even if power is momentarily disconnected from the circuit.

The integrated value achieved by the bi-directional integrator 36 is supplied at connection 38 to a display device 40, which is illustrated as a voltmeter. If the integrator 36 is implemented as a digital integrator, then a means is provided either in the integrator 36 or in the meter 40 for converting the digital values to voltage values which are readable by the meter 40. The voltmeter (and the entire circuit) may sometimes be referred to as a "fuel gauge", since it is intended to indicate, as accurately as possible, how much of the usable charge remains in the battery.

A signal corresponding to the integrated value from integrator 36 is also supplied on connection 42 to the range function generator 34. Range function generator 34 provides a feedback means which generates a signal as a function of the integrator signal on connection 42. This function signal is applied to resistor 32 of the summing network 30–32 for summation with the fixed reference voltage for application through connection 26 to the differential amplifier 22.

The output signal of the range function generator 34 is intended to be a voltage. Accordingly, the range function generator 34 must receive an analog voltage or current signal from integrator 36, or must incorporate a digital-to-analog converter. Therefore, in the embodiment as illustrated, where analog signals must be available for both the meter 40 and the range function generator 34, it is preferred that the integrator 36 either be an analog integrator, or that a digital to analog converter be incorporated in the integrator which can serve both the meter 40 and the range function generator 34. Accordingly, in the following discussion the integrator 36 is referred to as having voltage outputs. It will be understood that this means that the integrator is either an analog integrator, or is a digital integrator with a built-in digital-to-analog converter.

The effect of the summation of the fixed reference voltage and the range function generator output signal as seen by the differential amplifier 22 is to cause the summed reference voltage at connection 26 to be modified as a function of the integrated value stored in the bi-directional integrator 36. The direction of this signal modification is such that the reference voltage level at connection 26 is reduced as the battery progressively discharges. This is appropriate since the terminal voltage levels generally decrease as the battery discharges, and a heavy load causes a deeper negative excursion of the battery terminal voltage after the battery is partially discharged. Thus, after partial battery discharge, the net reference voltage at 26 must be lower in order to properly recognize a deviation caused by battery loading.

The bi-directional integrator 36 records and displays through the display device 40, an integrated value corresponding to a voltage representing the state of discharge of the battery. That voltage, as transmitted through the range function generator 34 and the summing network 30–32 to the differential amplifier 22, is compared in the differential amplifier 22 with the battery terminal voltage on a continuing basis. Thus, when there is a heavy loading of the battery, a negative excursion of battery terminal voltage below the level corresponding to the integrated value voltage will be detected and the difference will be amplified in the amplifier 22 and will operate through the convergence function generator to change the value stored in the integrator 36 at a restricted rate. Conversely, when the battery is subsequently completely unloaded, or is very lightly loaded, any positive excursion of the battery terminal voltage above the level corresponding to the integrated value voltage is detected by the differential amplifier 22 and is registered as a recovery in the bi-directional integrator 36.

Preferably an alarm device 44 is provided which is connected to the output 38 of the bi-directional integrator 36 and which is operable upon detection of a voltage corresponding to a condition of near full discharge of the battery to provide an alarm to the operator to warn the operator that it is time to recharge the battery 10. The alarm 44 may be an audible alarm, or a visual alarm, such as a red light. Preferably, also, a lockout feature is provided by means of a connection 38A to the lockout circuit 23. The lockout circuit 23 is operable upon the detection of a voltage signal indicating a substantially full battery discharge condition to open the switch 21, thus disabling the lift motor so that the operator is unable to perform any operation except to return the machine to the charging station for re-charging.

If the bi-directional integrator 36 is a digital integrator, the signals for the alarm 44 and the lockout circuit 23 are preferably obtained and detected as digital logic signals indicative of digital values corresponding to the state of discharge of the battery.

While the battery load involving the drive motor 14 and the lift motor 15 is described in terms of application to an industrial lift truck, it will be understood that the controls may be applied to other battery-powered apparatus. For such purposes, the lockout circuit 23 will be connected to lock out non-essential functions.

To further illustrate the operation of the circuit of FIG. 1, suppose, for instance, the battery 10 is a nominal 36-volt battery which is a type A industrial battery having a full charge stabilized open circuit voltage of about 38.4 volts and a nominally discharged stabilized open circuit voltage of 36.1 volts. Also, suppose that the meter gage 40 registers full at 5 volts and empty at zero volts. The integrator 36 thus must have a full output of 5 volts and an empty output at zero volts. Therefore, when the battery is in the discharged condition, the output of the integrator 36 through the range function generator 34 is preferably zero volts and there is thus a zero voltage from the range function generator to be summed with the fixed reference voltage at 28 as an input to amplifier 22. Also, the no-load battery voltage, under this circumstance, should cause no change in the integrated value stored in integrator 36. Thus, the output from amplifier 22 should be zero. This means that, at a battery output voltage of 36.1, indicating a discharged battery, the sum of the fixed reference voltage at terminal 28 and the zero output from range generator 34 should exactly match the input to amplifier 22 from connection 24 from the voltage divider 16. Thus, if the sum voltage at 26 is exactly 6 volts, for instance, the voltage divider 16 is set to provide exactly 6 volts from the battery 10 when the battery voltage is at the discharged level of 36.1 volts.

When the battery 10 is recharged to its fully charged voltage of 38.4 volts, and installed in the apparatus, the integrator 36 is preferably reset by reset circuit 25 to the fully charged value corresponding to +5 volts. The +5 volts, or some function thereof, is then supplied through connection 42 and range function generator 34 to the summing network 30–32 and is thus a part of the input on connection 26 to amplifier 22. The voltage added by the summing network from range function generator 34 should be sufficient to match the increase in the voltage from voltage divider 16 on account of the increase in battery terminal voltage due to the charge. However, the change in the voltage supplied from the voltage divider 16 to amplifier 22 is only 38.4 volts (the battery charged voltage) minus 36.1 (the battery discharged voltage) multiplied by the ratio of voltage division of the voltage divider 16 which is 6/36.1. The result of this calculation is 0.382 volts. That is the voltage which must be added to the voltage provied by the fixed reference at 28 by means of the range function generator 34 in response to the increase in range function input from 0 volts to +5 volts. The integration of the integrator 36 is then in such a direction as to cause the voltage output from the integrator to decrease as the battery is discharged, the system responding to negative voltage excursions of the battery terminal voltage during loading of the battery.

A reverse operating meter 40 and integrator 36 may be employed, if desired. Thus, the meter 40 may be designed to register full at zero volts and empty at 5 volts. The integrator 36 is then designed to integrate to a higher voltage as the battery discharges. The fixed reference voltage from source 28 is then selected to provide a summed value at 26 corresponding to the full charge battery voltage detected through voltage divider 16. Through a voltage polarity reversal, the output of the range function generator 34 is substracted in the summing network 30-32 from the reference voltage so that as the integrator voltage output increases during battery discharge, the net summed reference voltage at connection 26 decreases consistent with the corresponding decrease in the terminal voltage of the battery.

The circuit of FIG. 1 may be modified in various ways without departing from the principles described above. For instance, if a low voltage battery, in the order of 6 volts, is being monitored, the voltage divider 16 may be omitted from the circuit. Also, the low pass filter 18-20, while desirable, can often be omitted without serious consequences. On the other hand, an active filter may be employed instead of the passive filter which is illustrated.

Comparison amplifier 22 may have a gain of about 20. The amplifier 22 and the convergence function generator 35 may be combined in one amplifier unit. The integrator 36 may be implemented in various ways such as by means of a capacitor with a resistive charge changing circuit, or by means of a digital integrator device. The range function generator 34 may typically be a simple linear voltage divider, although a non-linear circuit may be required to match the characteristics of some batteries.

As previously mentioned above, when a newly recharged battery is first connected to the system, the state-of-charge indicator circuit, and particularly the bi-directional integrator 36, is preferably rapidly reset to indicate the charge condition by a reset circuit 25. Because of the positive as well as negative integration available with the bi-directional integrator 36, with a recharged battery, the state of charge indicator circuit would eventually adjust toward a reset condition even without the reset circuit 25. However, in order to provide a truly accurate indication of the state of charge of the battery at all times, a rapid initial reset of the state of charge indicator is very desirable. The reset circuit 25 schematically illustrates a preferred circuit configuration for accomplishing this purpose.

The reset circuit is connected at 46 to receive the input voltage and to respond to the sudden increase in voltage occasioned by the connection of battery 10 by the connector 12. The connection of the battery at connector 12 is assumed to mean that the battery has been previously disconnected to be charged, and has been fully charged, so that the reconnection of the battery indicates that the battery is fully charged. The voltage surge on connection 46 is detected by a single shot (monostable multivibrator) circuit 48. Circuit 48 is operable then to emit a pulse of predetermined duration on connection 50, which is the "set" input of a flip-flop circuit 52. As the result of setting the flip-flop 52, an output signal is available at connection 54 to enable a gate switch 56 to provide a signal to a fast synchronization circuit 58 which resets the bi-directional integrator 36 through a connection 60. The voltage which is gated by the gate circuit 56 is preferably the difference voltage from the difference amplifier 22 as connected to the gate circuit 56 through a connection 62. The establishment of the connection through gate 56 and through the fast synchronization circuit 58 to the bi-directional integrator 36 has the effect of very rapidly resetting the integrator 36 to indicate the battery charged condition. This causes a change in the output from the range function generator 34 which ultimately causes the output of the difference amplifier 22 to reach a null condition. When heat condition exists, it is detected by a null detector circuit 64, which is connected to receive the difference amplifier voltage from connection 62. When the null detector 64 detects the null condition, it provides an output at connection 66 to the reset input of flip-flop 52, causing that flip-flop to be reset, and thus disabling the gate 56 to discontinue the reset operation. The entire reset circuit 25 then remains inactive until such time as the battery 10 is again disconnected and then reconnected.

It is also possible to simplify the reset circuit 25 by eliminating the null detector 64 and the flip-flop 52, having the single shot circuit 48 directly enable the gate 56. The only requirement for such simplification is that the duration of the output pulse from the single shot circuit 48 must be longer than the maximum time required to accomplish the reset of the integrator 36. In any case, the reset operation ends when the null condition is achieved at the output of the difference amplifier 22 because there is then essentially no signal transmitted through the gate 56 to the fast synchronization circuit 58. After the single shot circuit 48 times out, the reset circuit 25 is inactive until the battery is again disconnected and reconnected.

If integrator 36 is a voltage responsive device, fast synchronization circuit 58 may simply consist of a resistive connection from the gate 56 to the integrator 36 to change the voltage charge on a capacitor within the circuit 36 which provides the integrator function, a lower resistance value being provided in the fast synchronization circuit 58 than is provided in the convergence function generator 35 so that rapid adjustment of the integrator storage value is provided.

On the other hand, if the integrator 36 is a digital integrator, then the fast synchronization circuit 58 may simply provide digital inputs to the integrator 36 to arbitrarily set the integrator 36 at a digital value corresponding to a full charge on the battery. With such an arrangement, the gate 56 and connection 62 may be omitted, the digital reset circuit at 58 being operated directly by the single shot circuit 48. In any case, the general principle is that the fast synchronization circuit 58 definitely operates rapidly, to drive the integrator at a rate 100 to 10,000 times as fast as the convergence function generator in order to achieve rapid reset of the integrator. The reset of the integrator must be achieved rapidly so that it is fully accomplished, and the reset circuit is shut off, before load is applied to the system.

Figure 2:
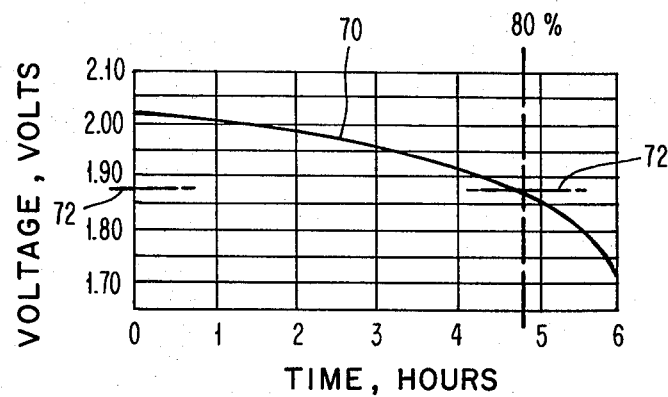
FIG. 2 is a voltage curve illustrating, on an expanded vertical scale, the decrease in battery cell voltage during discharge at a constant current resulting in full discharge after six hours.
Figure 3:
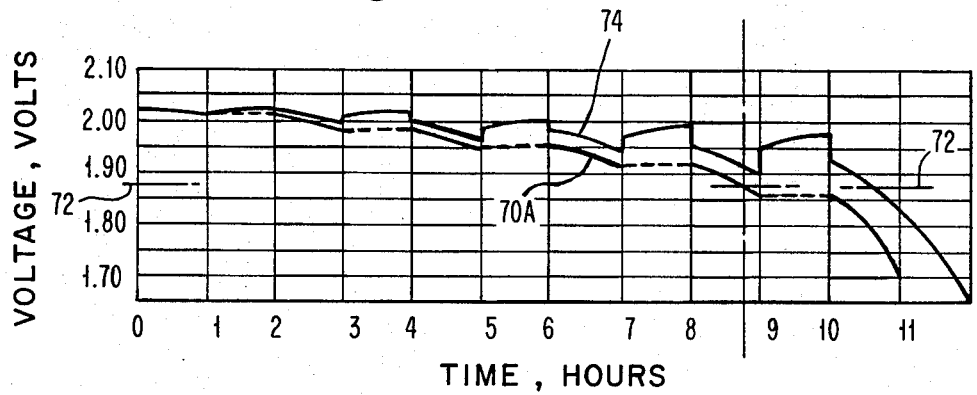
FIG. 3 shows two curves illustrating a direct extrapolation from the curve of FIG. 2 for an 11 hour discharge cycle, including a one hour rest period after each hour of discharge, and a corrected cell voltage curve showing the extension in battery output actually experienced because of the rest intervals.

In order to provide a more complete understanding of the significance of the invention and the operation of the invention, attention is directed to FIGS. 2 and 3.

FIG. 2 is a representation of a time versus terminal voltage characteristic curve 70 of a lead-acid storage battery cell, when discharged constantly at a rate which results in full discharge at the end of six hours. It is preferred that a lead-acid battery should not be discharged beyond 80% of its total capacity, which means that, in the illustration shown in FIG. 2, the battery should not be discharged beyond about four hours and forty eight minutes. This 80% discharge level is indicated by the dotted horizontal line 72, corresponding to a terminal voltage of about 1.875.

FIG. 3 shows two curves for a different, but similar voltage-time discharge characteristic where the same battery is discharged during one hour intervals, interrupted by one hour rest intervals, but at the same discharge rate corresponding to that used in FIG. 2. Two curves are illustrated in FIG. 3. The first curve, 70A, corresponds exactly to curve 70 presented in FIG. 2, except that the rest intervals of curve 70A are straight horizontal dotted lines, indicating that no further decrease in terminal voltage is taking place. This is the characteristic curve which might be logically anticipated in shifting to the discharge cycle of FIG. 3 from the cycle of FIG. 2. Using the curve 70A, it is anticipated that there will again be an available six hours of effective discharge of the cell over an elapsed period of eleven hours, with five one hour rest periods. However, it has been found that the battery actually follows a voltage characteristic which is more nearly represented by the upper curve 74 of FIG. 3. As illustrated in curve 74, there is actually a voltage recovery in the cell during each of the rest periods. Thus, during each rest period, the voltage recovery is clearly indicated by an upward step plus an exponential upward excursion, and this results in a longer total battery discharge cycle. That is, more ampere hours are available from the battery simply because it is permitted to rest and recover.

The positive integration provided by the convergence function generator 35 and the integrator 36 of the system of FIG. 1 permits a definite registration of such recovery during rest intervals of the battery, and thus permits the system to more clearly register and simulate the actual discharge condition of the battery under variable load conditions. It will be understood that the conditions illustrated in FIG. 3 are greatly simplified in order to illustrate a point. In actual practice, particularly with loads such as fork lift trucks, or electric road vehicles, the loading cycles are much more erratic, with both shorter and longer rest periods, and with shorter and longer load periods and with variations in the load currents. However, the principles illustrated in FIG. 3 are completely applicable to all of those situations. Considering FIGS. 2 and 3, it must be appreciated that while these curves represent idealized loaded and open circuit voltages, the actual terminal voltage of the battery during loaded and rest periods is definitely related to these voltage curves, the terminal voltage generally being below the open circuit voltage, and the terminal voltage actually corresponding rather closely to the theoretical open circuit voltage near the end of a long rest period.

The depletion of battery capacity in response to various load currents varies somewhat with different types of storage batteries. Likewise, storage batteries of different types also have different recovery rates when loads are reduced or removed. Accordingly, the convergence function generator 35 of FIG. 1 must have characteristics which match the discharge and recovery characteristics of the battery which is being monitored.

FIG. 4 illustrates one useful convergence function characteristic curve 76. Convergence function characteristic 76 provides for a rapid rise to a positive value of 2 volts output upon the achievement of zero difference voltage at the input of the convergence function generator. From thereon, as the difference voltage increases in a positive direction, the convergence function output voltage remains substantially constant until a difference voltage of plus 2 volts is achieved, and from then on there is a relatively smooth and constant input versus output voltage function.

For a negative difference input voltage, the convergence function is not at all linear, but drops suddenly to about minus 0.5 volts as the difference voltage reaches zero value, then provides a negative output which is nonlinear in response to negative difference voltages.

FIG. 5 illustrates another convergence function curve 78 which is very similar to the curve 76, and which is also very useful in carrying out the invention for particular battery designs. As illustrated in FIG. 5, the convergence function curve 78 has a vertical portion in the vicinity of the cross over from positive to negative input values similar to that of FIG. 4.

FIG. 6 is still another convergence function curve 80 showing still another useful characteristic for the convergence function having a dead band in the central portion of the curve in which the input voltage can vary from plus 2 volts to minus 1 volt without causing any change in the convergence function output. The polarities are reversed in the voltage measurements indicated on the horizontal axis for the input voltage values because the input voltage value is actually reversed in the preferred circuit of FIG. 8 (described below) for carrying out the characteristic of FIG. 6. The polarities of the voltages as plotted in FIG. 6 are therefore reversed in order to make the convergence function curve 80 comparable to the convergence function curves 76 and 78 of FIGS. 4 and 5. Thus, in each of the convergence function plots, the portion of the curve in the upper right hand quadrant of the diagram illustrates the results of battery terminal voltage conditions wherein the battery terminal voltage measurement exceeds the summed reference value. The portion of each convergence function curve in the lower left quadrant of each diagram represents the condition where the battery terminal voltage is less than the summed reference value. The horizontal "dead band" in the convergence function of FIG. 6, which is mentioned above, accommodates at least in part for the internal battery resistance voltage drop experienced with a battery upon changes in load conditions. Thus, the voltage changes due to the internal resistance of the battery are not so significant since they occur quite rapidly upon load changes, and do not, in themselves, indicate much of a change in the charge remaining upon the battery.

FIG. 7 illustrates a convergence function generator circuit 35 which is usable in producing the convergence function as illustrated in FIG. 5. It includes an operational amplifier 82 connected to receive the input difference voltage at connection 62. The input signal is supplied through a series resistor 84 to the positive input of the operational amplifier 82. The resistor 84 forms a voltage divider with another resistor 86 which is connected to ground, so that the voltage applied to the difference amplifier 82 is only a fraction of the difference voltage. The output of the convergence function circuit appears at connection 88. The combinations of resistors 90, 92, 94, 96, and 98 and the diodes 100, 102, 104, and 106, connected in a voltage division and feedback circuit to the negative input of the operational amplifier 82 provide the convergence function characteristic illustrated in FIG. 5. The diodes are all low-leakage silicon diodes and the resistors may have the resistance values as shown in the drawing, the symbol "K" being used to designate 1000. Thus, 1.8 "K" equals 1800 ohms.

The logarithmic current-voltage characteristics of the diodes in conjunction with series and shunt resistors permit the tailoring of many different non-linear transfer functions. Substitution of diodes formed of other materials such as germanium or gallium arsenide or gallium phosphide further increases the possible variations.

FIG. 8 is a circuit diagram for a convergence function circuit which is operable to produce the convergence function of FIG. 6. In order to simplify the combination of this circuit and the associated circuitry, the difference voltage applied to this circuit at connection 62A is inverted in polarity. The circuit includes four different operational amplifiers 108, 110, 112, and 114. The operational amplifiers 110 and 112 are respectively connected to control analog transmission gate devices 116 and 118. These are conveniently embodied as CMOS analog switch devices which are commonly packaged in a group of four switches. The control amplifier 110 is biased at plus 2 volts on its negative input and the control amplifier 112 with a minus 1 volt on its positive input terminal. Accordingly, for values of the input voltage between minus 1 volt and plus 2 volts, neither of the gate devices 116 and 118 is enabled so that there is a zero output at the output connection 88A. However, whenever the input voltage exceeds plus 2 volts, the output from amplifier 110 enables the gate device 116, connecting the output of the operational amplifier 108 to the output connection 88A. This provides the portion of the convergence function characteristic illustrated in the lower left hand quadrant of FIG. 6.

Conversely, for input voltage values which are negative by one volt or more, the amplifier 112 enables the gate device 118, connecting the output of amplifier 114 to the output connection 88A. The amplifier 114, with its feedback circuits, then generates the portion of the convergence function characteristic illustrated in the upper right hand quadrant of FIG. 6. The resistors 120 and 122 determine the gain (slope) of the output of amplifier 108, and the resistors 124 and 126 determine the gain (slope) of the output of amplifier 114. The voltage biases applied through resistors 128 and 130 to the respective amplifiers 108 and 114 provide the desired offset biases of the respective portions of the curve. The exact resistance values are not given, but the relative values are indicated in terms of a constant value "R". Typically "R" will have a value between 10,000 ohms and 1 megohm.

FIG. 9 is a detailed schematic diagram illustrating a preferred embodiment of the bi-directional integrator 36 of the FIG. 1. FIG. 9 shows a digital integrator embodiment employing a digital counter 132 as the digital integrating device. The outputs from the counter are converted to voltages by a digital to analog converter 134, the output voltage appearing at 38. The counter 132 is caused to count up or count down in response to pulses generated by voltage controlled oscillators 136 and 138 in response to voltage signals received from the convergence function generator on connection 35A. The voltage controlled oscillators 136 and 138 may be substantially identical and are operable to produce outputs only in response to positive voltage inputs at a pulse frequency proportional to the voltage. An inverter circuit 140 is connected ahead of the oscillator 138 so that, after inversion, the voltage controlled oscillator 138 responds to any negative convergence function signal voltage while the oscillator 136 responds to any positive convergence function signal voltage.

NOR Logic devices 142, 144, 146 and 148 are connected between the oscillators 136 and 138 and the counter 132 in order to provide the desired direction of count in response to pulses from each oscillator. The NOR gates 142–148 are each operable to provide a logic 1 output only when both inputs are logic 0. For any other input combinations, including any logic 1 input, the output of each gate is logic 0.

When the convergence function signal is positive, a series of logic 1 pulses is emitted from oscillator 136 on connection 150 to the lower input of NOR gate 142. This results in at least one logic 0 pulse to be emitted from the output of NOR gate 142 on connection 152, which forms the upper input to NOR gate 144. Also, while the convergence function value is positive, the output from oscillator 138 is a continuous logic 0 on connection 154. Accordingly, logic 0 values are available on both connections 152 and 154 to both inputs of the NOR gate 144, thus providing a logic 1 output from NOR gate 144 on connection 156. That logic 1 signal is fed back as one of the inputs to NOR gate 14, assuring that the output of that NOR gate on connection 152 remains a logic 0. Thus NOR gate 144 is latched into a condition providing a continuous logic 1 output, and NOR gate 142 is latched into a condition providing a continuous logic 0 output. These two gates, in the connection shown, form a "flip-flop". The signal on connection 156 is provided to an up/down control input of counter 132 which determines which direction the counter is to be counted. Assuming that a positive convergence function signal indicates that the battery is being discharged, the logic 1 signal at connection 156 will operate to control the counter 132 to be counted down.

Conversely, if the convergence function signal is negative, a series of logic 1 pulses appears on connection 154 and a constant logic 0 appears at connection 150. The flip-flop formed by NOR gates 142 and 144 then operates in the other state, with a constant logic 1 output on connection 152, and a constant logic 0 output on connection 156. This shifts the operation of the counter 132 to count in the other direction, which is up. The actual pulses to be counted are supplied through NOR gate 146 and inverter 148 and a connection 158 to the counter 132. NOR gate 146 detects the train of logic 1 pulses by shifting to a logic 0 output in response to each logic 1 pulse, and back to a logic 1 output in response to the intervals between the logic 1 pulses. The NOR gate 148 is connected as an inverter, to reverse the phase of the logic 0 pulses from NOR gate 146 for more accurate counting in synchronism with the shifts of the state of the flip-flop formed by the NOR gate 142 and 144.

While FIG. 9 illustrates a preferred embodiment, it will be understood that various logical variations of this circuit may be employed. For instance, separate convergence function circuits may be provided for response to positive and negative difference voltages respectively, and those separate convergence function circuits may be connected separately to supply the voltage controlled oscillators 136 and 138, respectively. Another modification may employ a simple polarity indicator for detecting the polarity of the convergence function signal or of the difference signal voltage to control the up/down input of counter 132 in conjunction with an absolute value amplifier for amplifying the absolute value of the convergence function signals to control a single voltage controlled oscillator connected to the counting input 158 of the counter 132.

While this invention has been shown and described in connection with particular preferred embodiments, various alterations and modifications will occur to those skilled in the art. Accordingly, the following claims are intended to define the valid scope of this invention over the prior art, and to cover all changes and modifications falling within the true spirit and valid scope of this invention.

I claim:

1. A battery state of charge indicator comprising
means for measuring battery terminal voltage on a continuing basis during both positive and negative voltage excursions with relation to a summed reference value,
means including a fixed reference voltage source and a summing means for providing a summed reference value for comparison with said measurement,
means for comparing said battery terminal voltage measurement with said summed reference value and for deriving a difference signal value,
means responsive to said difference signal value for generating convergence function signals which vary dependent on the magnitude and polarity of said difference signal value,
a bidirectional integrator connected to receive said convergence function signals and operable to integrate in one direction for positive convergence function signals and in the other direction for negative convergence function signals to provide an integrated output signal as a measure of the state of charge,
said means for providing a summed reference value including feedback means connected from the output of said integrator to said summing means for summation of a predetermined function of the integrated output signal with the fixed reference voltage from said fixed reference voltage source to thereby modify said summed reference value.

2. A state of charge indicator as claimed in claim 1 wherein said bi-directional integrator is operable to provide a time integration in response to either positive or negative conversion function signals.

3. A state of charge indicator as claimed in claim 2 wherein said bi-directional integrator includes a memory for maintaining the integrated value during interruptions of power.

4. A state of charge indicator as claimed in claim 2 wherein said feedback means includes a range function generator for providing a predetermined function of the integrated output signal for summation to modify the summed reference value.

5. A battery state of charge indicator as claimed in claim 2 wherein an alarm device is connected to receive integrated output signals from said bi-directional integrator, said alarm device being operable to provide an alarm condition in response to an output signal from said integrator indicating that the battery is nearly discharged to a desired limit.

6. A state of charge indicator as claimed in claim 2 wherein a lockout device is connected to receive integrated output signals from said integrator, said lockout device being operable in response to an integrator output signal indicating a condition very close to the desired discharge limit to lock out a non-essential battery load by causing an interruption of power to that non-essential load.

7. A state of charge indicator as claimed in claim 2 wherein a visual indicator device is connected to receive the output signal from said integrator to provide a visual indication of the integrated output signal as a measure of the state of charge of the battery.

8. A state of charge indicator as claimed in claim 2 wherein said means for measuring battery terminal voltage includes a low pass filter for eliminating transient voltage fluctuations in the battery terminal voltage as detected by the state of charge indicator.

9. A state of charge indicator as claimed in claim 8 wherein said means for measuring battery terminal voltage includes a voltage divider for detecting a fixed fraction of the battery terminal voltage as the measurement for terminal voltage.

10. A state of charge indicator as claimed in claim 2 wherein there is provided a reset circuit to rapidly set said bi-directional integrator to a condition indicating full charge on the battery whenever the battery is first connected to the state of charge indicator, said reset circuit including a single shot circuit connected at the input of the state of charge indicator to detect the increase in voltage occasioned by the connection of the battery and operable to emit just one pulse in response to that detection, and a fast synchronization circuit controlled by said single shot circuit connected to said bi-directional integrator to provide the full charge setting.

11. A state of charge indicator as claimed in claim 10 wherein a gate circuit is connected between said single shot circuit and said fast synchronization circuit, said gate circuit being operable to be enabled by a signal derived from the output of said single shot circuit, said gate circuit being connected to receive said difference signal and to gate said difference signal to said fast synchronization circuit to control said fast synchronization circuit for setting said bi-directional integrator.

12. A state of charge indicator as claimed in claim 11 wherein a flip-flop is connected between said single shot circuit and said gate circuit to receive a set input from said single shot circuit to put said flip-flop in the set state and to transmit a set output to said gate circuit as a means of controlling said gate circuit by said single shot circuit, a null detector circuit connected to receive said difference signal and operable to generate an output signal in response to a null condition in said difference signal, and the output signal of said null detector being connected to the reset input of said flip-flop in order to terminate the enabling signal to said gate by reset of said flip-flop when a null difference signal value is detected.

13. A state of charge indicattor as claimed in claim 2 wherein said bi-directional integrator comprises a digital counter with polarity responsive count up and count down circuits operable in response to the convergence function signals to increase and decrease the count stored in the counter in response to such signals.

14. A state of charge indicator as claimed in claim 13 wherein said bi-directional integrator includes a digital to analog converter connected to the output of said counter and operable to generate voltages related to the output signals from said counter indicating the count stored therein.

15. A state of charge indicator as claimed in claim 1 wherein said convergence function signal means is operable to produce a convergence function signal providing a different slope for difference signal values indicating a battery terminal voltage above the summed reference value than for difference signal values indicating a battery terminal voltage below the summed reference value.

16. A state of charge indicator as claimed in claim 15 wherein a dead band is provided in the convergence function in the vicinity of the cross over between a positive and a negative difference voltage input.

17. A state of charge indicator as claimed in claim 15 wherein at least a portion of the convergence function provides a non-linear change in output in response to changes in input voltage.

18. A state of charge indicator as claimed in claim 17 wherein a non-linear portion of the convergence function is provided for difference signal values indicating a battery terminal voltage below the summed reference value voltage.

* * * * *

UNITED STATES PATENT AND TRADEMARK OFFICE
CERTIFICATE OF CORRECTION

PATENT NO. : 4,388,618
DATED : June 14, 1983
INVENTOR(S) : EUGENE P. FINGER

It is certified that error appears in the above-identified patent and that said Letters Patent are hereby corrected as shown below:

Column 1, line 48, "depressed value during value loading," should read --depressed value during loading,--.

Column 7, line 4, "provied" should read --provided--.

Column 8, line 21, "when heat condition" should read --when that condition--.

Column 8, line 65, "generator in order" should read --generator 35 in order--.

Column 10, line 10, "From thereon," should read --From there on,--.

Column 12, line 34, "NOR gate 14," should read --NOR gate 142,--.

Column 13, line 56, "conversion" should read --convergence--.

Column 14, line 65 "indicattor" should read --indicator--.

Signed and Sealed this

Twentieth Day of September 1983

[SEAL]

Attest:

GERALD J. MOSSINGHOFF

Attesting Officer    Commissioner of Patents and Trademarks